United States Patent
Becker et al.

(10) Patent No.: US 7,608,856 B2
(45) Date of Patent: Oct. 27, 2009

(54) ELECTRONIC DEVICES COMPRISING ORGANIC SEMICONDUCTORS

(75) Inventors: Heinrich Becker, Hofheim (DE); Reinhard Strey, Dormagen (DE); Klaus Meerholz, Rösrath (DE); David Christoph Müller, München (DE)

(73) Assignee: Merck Patent GmbH (DE)

( * ) Notice: Subject to any disclaimer, the term of this patent is extended or adjusted under 35 U.S.C. 154(b) by 120 days.

(21) Appl. No.: 11/587,462

(22) PCT Filed: May 3, 2005

(86) PCT No.: PCT/EP2005/004793

§ 371 (c)(1), (2), (4) Date: Jan. 30, 2007

(87) PCT Pub. No.: WO2005/109539

PCT Pub. Date: Nov. 17, 2005

(65) Prior Publication Data

US 2007/0221914 A1 Sep. 27, 2007

(30) Foreign Application Priority Data

May 3, 2004 (DE) .................... 10 2004 021 567

(51) Int. Cl.
H01L 35/24 (2006.01)
H01L 51/00 (2006.01)

(52) U.S. Cl. .............. 257/40; 257/79; 257/80; 313/498; 313/504

(58) Field of Classification Search ........... 257/40, 257/79, 80, 88; 313/498, 504
See application file for complete search history.

(56) References Cited

U.S. PATENT DOCUMENTS

| | | | |
|---|---|---|---|
| 4,017,148 A | | 4/1977 | Taylor |
| 4,960,635 A * | | 10/1990 | Erdelen et al. ............ 428/220 |
| 5,396,363 A * | | 3/1995 | Valette ..................... 359/248 |
| 5,840,217 A | | 11/1998 | Lupo et al. |
| 6,060,530 A | | 5/2000 | Chaouk et al. |
| 6,335,480 B1 | | 1/2002 | Bach et al. |
| 6,458,909 B1 | | 10/2002 | Spreitzer et al. |
| 6,890,703 B2 * | | 5/2005 | Hawker et al. ............ 430/311 |
| 7,250,632 B2 * | | 7/2007 | Hubert et al. ............... 257/79 |
| 7,358,661 B2 * | | 4/2008 | Kuma ........................ 313/504 |
| 2004/0017148 A1 | | 1/2004 | Redecker |
| 2004/0054152 A1 | | 3/2004 | Meerholz et al. |

(Continued)

FOREIGN PATENT DOCUMENTS

DE 103 40 711 4/2005

(Continued)

OTHER PUBLICATIONS

Bayerl, et al, "Crosslinkable hole-transport material for preparation of multilayer organic light emitting deicies by spin-coating", Macromol, Rapid Commun. vol. 20, pp. 224-228 (1999).

*Primary Examiner*—Phuc T Dang
(74) *Attorney, Agent, or Firm*—Connolly Bove Lodge & Hutz LLP

(57) ABSTRACT

The present invention describes organic electronic devices in which at least one organic layer of low refractive index is introduced. The light output of the electronic devices is thereby improved.

37 Claims, 2 Drawing Sheets

AFM photograph of a film obtained by phase separation and selective washing-out (the edge length of the detail is 10 μm).

U.S. PATENT DOCUMENTS

| | | | |
|---|---|---|---|
| 2005/0072021 A1 | 4/2005 | Steiger et al. | |
| 2005/0122035 A1 | 6/2005 | Birnstock et al. | |
| 2006/0127663 A1 | 6/2006 | Strey et al. | |
| 2006/0251886 A1* | 11/2006 | Muller et al. | 428/339 |
| 2007/0205400 A1* | 9/2007 | Kato et al. | 252/500 |
| 2007/0228943 A1* | 10/2007 | Yamada et al. | 313/504 |

FOREIGN PATENT DOCUMENTS

| | | |
|---|---|---|
| DE | 10 2004 009 355 | 9/2005 |
| EP | 0 676 461 | 10/1995 |
| EP | 1 100 129 | 5/2001 |
| FR | 2 559 492 | 8/1985 |
| JP | 2001-106782 | 4/2001 |
| JP | 2002-117984 | 4/2002 |
| WO | WO-94/05045 | 3/1994 |
| WO | WO-96/20253 | 7/1996 |
| WO | WO-98/03566 | 1/1998 |
| WO | WO-98/27136 | 6/1998 |
| WO | WO-98/48433 | 10/1998 |
| WO | WO-00/04593 | 1/2000 |
| WO | WO-02/10129 | 2/2002 |
| WO | WO-03/038923 | 5/2003 |
| WO | WO-03/047316 | 6/2003 |
| WO | WO-03/061026 | 7/2003 |
| WO | WO-2004/058386 | 7/2004 |

* cited by examiner

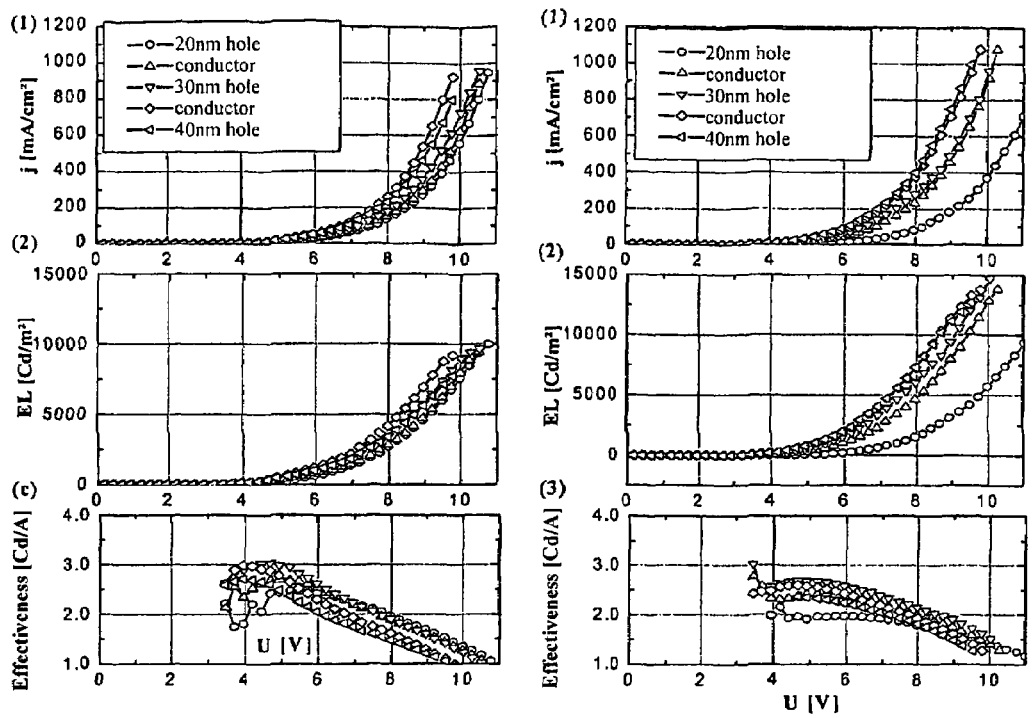
Figure 1: U/I characteristic lines for variation of the layer thickness of the hole conductor and a blue
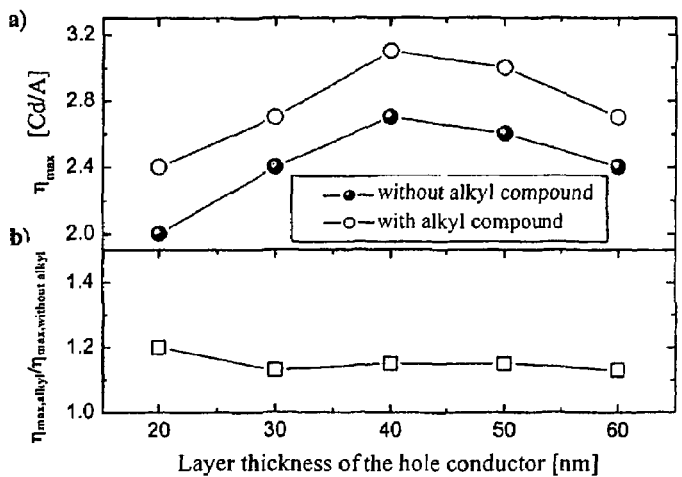
Figure 2:
a) Maximum efficiencies as a function of the hole-conductor layer thickness without and with alkyl compound B,
b) Ratio of the maximum efficiencies with and without alkyl compound as a function of the hole-conductor layer thickness.

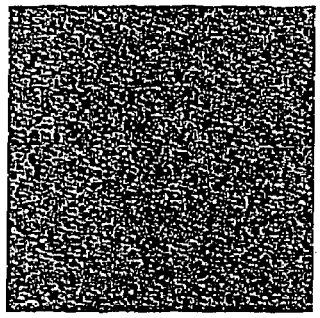
Figure 3: AFM photograph of a film obtained by phase separation and selective washing-out (the edge length of the detail is 10 µm).

ELECTRONIC DEVICES COMPRISING ORGANIC SEMICONDUCTORS

RELATED APPLICATIONS

This application is a national stage application (under 35 U.S.C. 371) of PCT/EP2005/004793 filed May 3, 2005, which claims benefit of German application 10 2004 021 567.7 filed May 3, 2004.

Electronic devices which comprise organic, organometallic or polymeric semiconductors are being used ever more frequently in commercial products or are just about to be introduced onto the market. Examples which may be mentioned here of products which are already commercial are organic-based charge-transport materials (generally hole transporters based on triarylamine) in photocopiers and laser printers, and organic or polymeric light-emitting diodes (OLEDs, PLEDs) in display devices. Organic solar cells (O-SCs), organic optical amplifiers, sensors or organic laser diodes (O-lasers) are well advanced at a research stage and could achieve major importance in the future.

These devices have the following general layer structure, which is adapted correspondingly for the individual applications:

(1) substrate, generally made of glass or plastic;
(2) contact (electrode): conductive substance, frequently metallic or inorganic;
(3) possibly charge-injection layer, frequently made of a conductive, doped polymer;
(4) organic semiconductor, optionally a plurality of layers;
(5) possibly insulation layer;
(6) second contact (second electrode): as (2), materials as mentioned above;
(7) circuitry;
(8) encapsulation.

For the above-mentioned applications, at least one of the electrodes here must be transparent or at least partially transparent in order to be able to input light, as in the case of organic solar cells or detectors, or emit light, as in the case of organic or polymeric light-emitting diodes, organic laser diodes or organic optical amplifiers.

In spite of all advances achieved in recent years, there are still problems which require significant improvement. The structure of a conventional OLED comprising a plurality of layers having different optical properties (different refractive indices n) results, in accordance with the rule of thumb $\eta_{out} \approx 1/(2n^2)$ (where $\eta_{out}$ describes the output efficiency, i.e. the probability with which a photon generated in the emission zone is output from the diode, and n is the highest refractive index of the device), in a loss of more than 70% of the light produced due to internal reflection/wave conduction and absorption in the layers. In a conventional OLED, only about 20-30% of the light produced is thus utilised, while about 50% is lost due to wave conduction in the ITO (indium-tin oxide)/polymer layers and about 30% due to wave conduction in the substrate and absorption in the wave guides (C. F. Madigan et al., *Appl. Phys. Lett.* 2000, 76, 1650). While it has recently been possible to increase the internal electro-optical efficiency to close to the theoretical limit, the light output still needs to be improved significantly. This will contribute to an increase in the lifetime and a reduction in the power consumption, significantly increasing the potential for use of OLEDs. The methods described to date of increasing the light output of OLEDs have succeeded by means of structures or layers which are not actively linked to the OLED function. An essential disadvantage is the lack of compatibility with OLED production or the use of very complex methods and processes which do not justify the result. The methods in some cases result in significant restrictions of the fields of application of OLEDs. Some methods are described briefly below.

The use of microlenses has enabled the output efficiency to be increased by a factor of about 1.5 (C. F. Madigan et al., *Appl. Phys. Lett.* 2000, 76, 1650). However, the light obtained is not emitted in the direction of the perpendiculars to the surface, and the mechanical surface condition is modified adversely. The requisite precise alignment of the microlenses with the pixel element of a display is complex. Apart from for illumination applications, the unsharp appearance is disadvantageous. In addition, colour shifts occur when viewed from the sides.

Structuring of the glass substrate or a suitable layer, such as $SiN_x$, enables the production of one-, two- and three-dimensional photonic crystals having a regular or irregular period (Y.-J. Lee et al., *Appl Phys. Lett.* 2003, 82, 3779). These extract light from the ITO/polymer interface, which is lost in the layer having the higher refractive index (ITO) due to combined wave conduction and absorption. The structure widths and depths are in the region of a few ten to a few hundred nanometers. The improvement achieved in the light output is in the region of 50%. However, the emission is angle-dependent, and the processes are technically very complex.

The use of Bragg diffraction gratings can result in an increase in the light yield by a factor of 2 (J. M. Lupton et al., *Appl. Phys. Lett.* 2000, 77, 3340). A layer is introduced between substrate and ITO electrode here and structured. The period of the grating is in the region of half the emission wavelength, with modulation depths in the order of magnitude of the OLED thickness (50-100 nm). Since the planar layer structure is lost in the process, the layer thickness of the OLED must be doubled in order to prevent electrical defects, resulting in a drastic reduction in the internal efficiency of the component.

The construction of an OLED between two reflective electrodes enables utilisation of microresonator effects. The modes of emission are restricted here compared with a vacuum in such a way that only a few modes are emitted when the resonance conditions are satisfied, which allows a very narrow light emission of a few nm (N. Takada et al., *Appl. Phys. Lett.* 1993, 63, 2032). Since the luminescence spectra of polymers are very broad, the intensity of the transitions which are no longer allowed owing to the spatial restriction is input into these modes. The output efficiency can be increased by a factor of 10, but the emission is highly directed. A further disadvantage is again the increased layer thickness of the active layers in order to satisfy the resonance condition; this should be in the region of half the wavelength of the emission light. These thick emission layers are generally outside the optimum, which results in a reduction in the efficiency. In addition, the production of the layers with the requisite precision is very complex.

The insertion of an aerogel layer of low refractive index between the anode and the glass substrate reduces the internal reflection in the glass substrate and increases the light yield by a factor of 2 (EP 1100129; T. Tsutsui et al., *Adv. Mater.* 2001, 13, 1149). The difficult preparation of the aerogel and its mechanical lability are disadvantageous. In addition, the ITO electrode can only be applied after preparation of the aerogel, which consequently cannot be carried out by the common methods. Furthermore, the active layers (ITO and organic semiconductor) are very thin (in total in the region of 200 nm). Little wave conduction is consequently observed in this layer. For practical use, however, these layers cannot be chosen to be so thin. Thus, the ITO electrode must in practice be in the order of 170 nm thick in order to ensure an adequate electrical conductivity. In addition, the organic semiconductor is generally constructed from a plurality of layers, which in total also have a thickness of greater than 100 nm. The ITO and semiconductor layers thus become thicker, and losses are also suffered here due to total reflection and wave conduction in the ITO/semiconductor layer which cannot be compensated by the selected structure of the device.

In WO 03/061026, organic inhomogeneities of different refractive index are introduced into at least one of the organic layers in order thus to interfere with the wave conduction effects. In practice, the separation of various polymer blends is used, which results in scattering of the light and thus in an increase in the output efficiency. However, this method has the disadvantage that phase separation in the active layers of an OLED can result in significant impairment of the electronic properties of the OLED, so that a restricted function of the OLED must be accepted for the higher output efficiency.

As is thus seen, significant improvements are still necessary in the area of output. An important aim is thus the increase in the light yield and, connected thereto, the reduction in the power consumption. With a lower power consumption, the lifetime of the device can also be increased. It is particularly important here that the increase in the output can be achieved in a technically simple manner and is compatible with the generally conventional structure of the electronic device.

Surprisingly, it has now been found that the admission and output of light from an organic electronic device is significantly improved if a conducting or semiconducting organic layer which has a low refractive index is introduced between the transparent electrode and the organic semiconductor.

The invention therefore relates to organic electronic devices comprising cathode and anode, at least one of which is transparent, and at least one layer comprising at least one organic semiconductor, characterised in that at least one organic layer which has a low refractive index is introduced between the transparent electrode and the layer which comprises the organic semiconductor;

This organic layer of low refractive index is abbreviated to "buffer layer" below.

For the purposes of this invention, a low refractive index is taken to mean a refractive index n<1.6, preferably n<1.5, particularly preferably <1.4. The refractive index of organic materials is generally between 1.4 and 1.7, that of the relevant organic hole-transport materials is between 1.6 and 1.7. The refractive index n of the buffer layer is particularly preferably between 1.2 and 1.4. An even lower refractive index is also preferred, but can only be achieved technically with great difficulty. The refractive index of the thin layers can be measured by various methods, for example by ellipsometry (R. M. A. Azzam, N. M. Bashara, "Ellipsometry and Polarised Light", North Holland Physics, 1987), by means of a prism coupler or by surface plasmone resonance spectroscopy.

For the purposes of this invention, a transparent cathode or anode is taken to mean a cathode or anode which is transparent in the region of the incident or emitted light, preferably in the range from 400 to 800 nm, where the transmission is preferably at least 30%, particularly preferably at least 50%, very particularly preferably at least 80%. In some device structures (light-emitting electrochemical cell), unipolar electrodes are also used.

The organic electronic device is preferably an organic or polymeric light-emitting diode (OLED, PLED, for example EP 0676461, WO 98/27136). In this case, at least one of the organic semiconductors is an emitting (fluorescent or phosphorescent) compound.

The organic electronic device is furthermore preferably an organic solar cell (O-SC, for example WO 98/48433, WO 94/05045).

The organic electronic device is furthermore preferably an organic laser diode (O-laser, for example WO 98/03566).

The organic electronic device is furthermore preferably an organic field-quenching device (O-FQD, for example U.S. Ser. No. 04/017,148).

The organic electronic device is furthermore preferably an organic optical amplifier.

The organic electronic device is furthermore preferably an organic optical detector.

For the purposes of this invention, organic means that at least one conducting or semiconducting organic buffer layer and at least one layer comprising at least one organic semiconductor are present; it is also possible for further organic layers (for example electrodes) to be present. It is also entirely possible for layers not based on organic materials, such as, for example, inorganic interlayers or electrodes, to be present.

In the simplest case, the electronic device is constructed from substrate, electrode, conducting or semiconducting buffer layer of low refractive index according to the invention, organic semiconductor layer and counterelectrode. It may also be appropriate to introduce further layers, for example a charge-injection layer comprising a conductive doped polymer and/or further organic semiconductor layers, into the device.

The electrodes are generally selected in such a way that their potential matches the potential of the adjacent organic layer as well as possible in order to ensure the most efficient electron or hole injection possible.

Preferred as cathode are metals having a low work function, metal alloys or multi-layered structures with various metals, such as, for example, alkaline earth metals, alkali metals, main-group metals or lanthanides (for example Ca, Ba, Mg, Al, In, Mg, Yb, Sm, etc.). In the case of multilayered structures, further metals which have a relatively high work function, such as, for example, Ag, may also additionally be used, in which case combinations of the metals, such as, for example, Ca/Ag or Ba/Ag, are generally used. The cathodes or cathode combinations usually have a thickness of between 10 and 10,000 nm, preferably between 20 and 1000 nm. It may also be preferred to introduce a thin interlayer of a material having a high dielectric constant between a metallic cathode and the organic semiconductor (or other functional layers optionally present). Suitable for this purpose are, for example, alkali metal or alkaline earth metal fluorides, but also the corresponding oxides (for example LiF, $Li_2O$, $BaF_2$, MgO, NaF, etc.). The layer thickness of this dielectric layer is preferably between 0.1 and 10 nm.

Preferred as anode are materials having a high work function. The anode preferably has a potential of greater than 4.5 eV vs. vacuum. Suitable anode materials are conductive mixed metal oxides, in particular indium-tin oxide (ITO) or indium-zinc oxide (IZO). Also suitable for this purpose are metals having a high redox potential, such as, for example, Ag, Pt or Au. Metal/metal oxide electrodes (for example Al/Ni/$NiO_x$, Al/Pt/$PtO_x$) may also be preferred. The anode may also consist of a conductive, doped organic material (for example a conductive, doped polymer).

For the input and/or output of light, at least one of the electrodes must be transparent. A preferred structure uses a transparent anode, where structures having transparent cathodes are also known. Particularly preferred transparent anodes are indium-tin oxide (ITO) or indium-zinc oxide (IZO). Very particular preference is given to an indium-tin oxide anode; this usually has a refractive index $n_{ITO}$ in the range 1.6-2.0. Preference is furthermore given to conductive, doped organic materials, in particular conductive doped polymers.

Suitable as organic semiconductors are in principle low-molecular-weight, oligomeric, dendritic or polymeric semi-conducting materials. It is also possible here for a plurality of organic semiconductors to be present in mixed form in a single layer, or one or more organic semiconductors may be used together with one or more compounds which are not organic semiconductors. It is also possible for a plurality of layers of organic semiconductors to be present. For the purposes of this invention, an organic material is intended to be taken to mean not only purely organic compounds, but also organometallic compounds and metal coordination compounds having organic ligands. The oligomeric, dendritic or polymeric materials here may be conjugated, non-conjugated or also partially conjugated. Typical representatives of conjugated polymers, as can be used, for example, in PLEDs or O-SCs, are poly-para-phenylenevinylene (PPV), systems which are based in the broadest sense on poly-p-phenylene (PPP), polyfluorenes, poly(spirobifluorenes), poly(indenofluorenes), polyphenanthrenes, polythiophenes, etc., and derivatives of these structures. The layer thickness of the organic semiconductor or the total layer thickness of the organic semiconductors if a plurality of layers are used is, depending on the application, preferably 10-300 nm, particularly preferably 20-150 nm, very particularly preferably 30-100 nm, in particular 40-80 nm.

It may also be preferred to use a conductive organic compound as charge-injection layer, in particular a hole-injection layer on the anode. For example, it is possible to use various organic, doped conductive polymers here, but also phthalocyanines, such as, for example, copper phthalocyanine. Preference is given to polymers which have a conductivity of $>10^{-8}$ S/cm, depending on the application. As hole-injection layer, the potential of the layer is preferably 4 to 6 eV vs. vacuum. The layer thickness is preferably between 10-500 nm, particularly preferably between 20-250 nm. Particular preference is given to the use of doped derivatives of polythiophene, very particularly preferably poly(ethylenedioxythiophene) (PEDOT), and polyaniline (PANI). The doping is generally carried out by means of Brönsted and/or Lewis acids or oxidants. The conductive polymer is generally applied from an aqueous solution or dispersion and is insoluble in organic solvents. This enables the subsequent layer to be applied without problems from organic solvents.

In a preferred embodiment of the invention, the organic buffer layer of low refractive index is produced by using compounds of low refractive index or chemically modifying the compounds used in such a way that compounds or layers of low refractive index are formed.

In a particularly preferred embodiment of the invention, the organic buffer layer of low refractive index is produced by using long alkyl chains in addition to the electronically active compounds or as substituents thereon. These generally have a lower refractive index than the compounds which are usually used as electronically active compounds, for example hole-transport compounds, and are thus able to lower the overall refractive index of the layer. This is also confirmed, for example, at the back in Example 1.

In a further particularly preferred embodiment of the invention, the organic buffer layer of low refractive index is produced by substituting the electronically active compounds with fluorine. Fluorinated compounds generally have a lower refractive index and are thus able to lower the overall refractive index of the layer.

In a very particularly preferred embodiment of the invention, fluorine-substituted electronically active compounds are used in combination with long alkyl chains, which may optionally also be fluorinated. This enables the refractive index of the layer to be lowered still further.

In a further preferred embodiment of the invention, the organic buffer layer of low refractive index according to the invention is a porous layer or a foam layer whose pore size is in the nanometer region. A material of low refractive index is thereby produced.

For the purposes of this invention, a foam is taken to mean a structure of gas-filled, spherical or polyhedral cells which are delimited by solid cell walls. The cell walls form a coherent structure. Foams can be fixed by solidification of the constitutive substance. The solidified foams may be open-pored or closed-pored.

It may also be preferred to use a plurality of buffer layers of low refractive index, resulting in (dis)continuous graduation.

Penetration of liquids (for example solvents) or gases (for example atmospheric oxygen or further air constituents) into the buffer layer, for example on application of the organic semiconductor layer, should be avoided.

It is therefore preferred for the pores of the buffer layer to be closed. Closed pores are sealed in themselves and do not allow any medium to penetrate in.

It may likewise be preferred to use an open-pored buffer layer whose surface is sealed, for example by thermal treatment, again preventing penetration of liquids or gases. Open pores are in communication with the surrounding medium. The thermal treatment can be carried out, for example, by irradiation with a laser or by large-area infrared irradiation (for example in accordance with WO 03/038923).

The average pore size of the layer is preferably in an order of magnitude of 5 to 500 nm, particularly preferably in an order of magnitude of 10 to 200 nm, very particularly preferably in an order of magnitude of 10 to 100 nm, where the pore size must be smaller than the layer thickness of the buffer layer, preferably smaller than half the layer thickness of the buffer layer, particularly preferably smaller than a quarter of the layer thickness of the buffer layer. Preference is given to a narrow pore-size distribution. The pore size and the pore-size distribution can be determined, for example, by scanning electron microscopy and by transmission electron microscopy.

The porosity P of the buffer layer is preferably between 20 and 80%, particularly preferably between 30 and 60%, very particularly preferably between 40 and 50%, where the porosity is taken to mean the proportion of the volume that is taken up by cavities (pores). The porosity which is relevant for this application can be determined from the ratio of the refractive indices of the porous layer ($n_S$) and of the non-porous layer ($n_P$). To a good approximation, the following applies to the porosity P (in %): $P=100\cdot[(n_P-n_S)/(n_P-1)]$, as arises due to simple considerations. The refractive index of the respective thin layers can in turn be determined by ellipsometry, by means of a prism coupler or by surface plasmone resonance spectroscopy, as described above.

The pores may be randomly distributed in the buffer layer, or they may be ordered, for example in a cubic closest packing or hexagonal closest packing.

The pores may be spherical or elliptical. In the case of elliptical pores, they may lie with their main axis in the film, or they may be with their main axis perpendicular to the film, or they may adopt intermediate positions.

The buffer layer preferably has hole conductivity and is introduced between the organic semiconductor layer and the transparent anode (or the conductive doped polymer, if present). The layer thickness is preferably in the range 50-1000 nm, particularly preferably in the range 80-500 nm, very particularly preferably in the range from 100 to 400 nm, in particular in the range from 100 to 300 nm. A layer thickness in this range has proven particularly preferred since it is on the one hand sufficiently thin still to transport the charge carriers well, but on the other hand the organic semiconductor layer and the electrode are fully decoupled optically from one another, as has been shown experimentally. The potential of the layer is preferably between the potential of the electrode (or the conductive, doped polymer) and that of the organic semiconductor in order that the charge injection is not hindered, i.e. that both the charge injection of the electrode into the buffer layer and also from the buffer layer into the organic semiconductor is favoured. This can be achieved through a suitable choice of the materials for the buffer layer and suitable substitution of the materials.

In a preferred embodiment of the invention, the porous layer is produced by means of porogens, which are removed from the layer after the layer formation. For the purposes of this invention, a porogen is taken to mean compounds which are removed from the layer, for example by rinsing with a suitable solvent, after the layer formation and any conditioning of the layer. Suitable porogens are, in particular, compounds which are chemically similar to those which represent the electronically active compound. This can be explained through similar compounds not interfering with the operation of the organic electronic device if they are not completely removed from the layer and residues of the compound remain in the layer. In a particularly preferred embodiment of the invention, the layer is crosslinked. The way in which the crosslinking can be carried out is described in detail at the back. The porous buffer layer can be produced, for example, by forming a layer of the crosslinkable compound for the buffer layer and the porogen from solution, if necessary with addition of auxiliary compounds, such as, for example, a photoacid. Conditioning of this layer results in phase separation of the crosslinkable compound and the porogen. After the conditioning, the crosslinkable domains of the layer can, as described at the back, be crosslinked, and the porogen can be washed out with a suitable solvent. A porous layer remains behind. This is confirmed, for example, at the back in Example 2.

In a further preferred embodiment, the porous layer is foamed. The foaming can be carried out by physical or chemical methods. Physical blowing agents are compressed gases (for example nitrogen), supercritical fluids or low-boiling, optionally substituted hydrocarbons which do not leave any undesired by-products behind in the foam. On evaporation of the blowing agent, the substance supersaturated with gas expands with bubble formation. The evaporation and, where appropriate, cooling increase the viscosity, and the foam skeleton solidifies. Particularly preferred blowing agents are supercritical fluids since foams having the desired pore size and having closed pores can be formed thereby. A particularly preferred supercritical fluid comprises supercritical carbon dioxide. In order to dissolve the material of the organic buffer layer better, it may be preferred to add further organic compounds or solvents to this medium. This preference can be explained by the relatively easy handling, the good solubility of a large number of organic compounds therein and the inertness during operation of the electronic device.

Chemical blowing agents are solids which decompose at elevated temperature or on exposure to other energy with liberation of a gas, usually organic oxygen or nitrogen compounds, for example azo compounds, diazo compounds, azido compounds, nitroso compounds or hydrazides (for example J. H. Saunders, R. H. Hansen, in K. C. Frisch, J. H. Saunders (ed.), *Plastic foams,* Part I, Chap. 2, Marcel Dekker, New York 1972; W. S. Fong, *Foamed Plastics, Suppl.* A, Process Economics Program Report 97A, SRI Int., Menlo Park, Calif., January 1984, 29-36). Further suitable porogens are azoisobutyronitrile, diethyl azodicarboxylate, diazodinitrophenol, 2,6-bis(4-azidobenzylidene)-4-methylcyclohexanone, s-trisazidotriazene (cyanuric azide), tetrazenes, tetrabutylammonium azide, tetrabutylammonium acetate and acetone peroxide. The use of inorganic blowing agents, for example carbonates, is also possible. It is furthermore possible to liberate the blowing agent in the form of a gas during a crosslinking reaction as the reaction product of the crosslinking, for example carbon dioxide during the formation of urethanes from isocyanates and water.

In particular for physically foamed layers, it may be appropriate to add nucleation seeds. These are finely dispersed solids on which initial gas bubbles form from the solution supersaturated with gas or supercritical fluid. The porosity and pore size can be controlled through the concentration of the nucleation seeds.

It is also possible to begin with an emulsion of the blowing agent in a liquid, which can then either be expanded in order to foam the emulsion droplets or can be fixed directly in order to empty the emulsion droplets by subsequent processes and convert them into cavities. The number and size of the emulsion droplets directly determines the properties of the later foam here.

A further method for the production of foams which can be used is the "Principle of supercritical microemulsion expansion (POSME)", where microemulsions or finely divided emulsions are developed from a supercritical blowing agent in polymer, as described in WO 04/058386.

It may be very particularly preferred here for the above-mentioned methods for the production of a low refractive index to be combined with one another since this enables a layer having a particularly low refractive index to be produced. Thus, it may be particularly preferred for, for example, compounds having long alkyl chains and/or fluorinated compounds to be used in a porous or foamed layer.

In order to increase the mechanical stability of the porous buffer layer, irrespective of whether this has been produced by porogens or foamed, it is preferred to crosslink it. The crosslinking of the buffer layer is in addition particularly preferred if the following layer is to be applied from solution, since the buffer layer becomes insoluble due to the crosslinking and can no longer be attacked by solvents. Semi-conducting luminescent polymers which can be chemically crosslinked are disclosed, for example, in WO 96/20253. Various methods are suitable for the crosslinking, for example cationic, anionic or free-radical polymerisation, as are familiar to the person skilled in the art.

Preference is given to cationic polymerisation via the following functional groups:
  1) electron-rich olefin derivatives,
  2) heteronuclear multiple bonds with heteroatoms or hetero groups or
  3) rings containing heteroatoms (for example O, S, N, P, Si) which react by cationic ring-opening polymerisation.

Preference is given to organic materials in which at least one H atom has been replaced by a group which reacts by cationic ring-opening polymerisation. A general overview of cationic ring-opening polymerisation is given, for example, by E. J. Goethals et al., "Cationic Ring Opening Polymerisation" (New Methods Polym. Synth. 1992, 67-109).

In general, non-aromatic cyclic systems in which one or more ring atoms are, identically or differently, O, S, N, P, Si, etc. are suitable for this purpose.

Oxetane-containing semiconducting polymers, as described in WO 02/10129, have proven particularly suitable. These can be crosslinked in a targeted and controlled manner through addition of a photoacid (compound which liberates protons after irradiation with light of suitable energy). Also suitable are crosslinkable low-molecular-weight compounds, such as, for example, cationically crosslinkable triarylamines (M. S. Bayer, T. Braig, O. Nuyken, D. C. Müller, M. Groβ, K. Meerholz, *Macromol. Rapid Commun.* 1999, 20, 224-228; D. C. Müller, T. Braig, H.-G. Nothofer, M. Arnoldi, M. Groβ, U. Scherf, O. Nuyken, K. Meerholz, *ChemPhysChem* 2000, 207-211). The use and crosslinking of oxetane-containing polymers in organic electronic devices is described, for example, in the unpublished applications DE 10340711.1 and DE 102004009355.5.

Preference is given to low-molecular-weight, oligomeric, dendritic or polymeric organic semiconductors and conductors in which at least one H atom has been replaced by a group of the formula (1), formula (2), formula (3) or formula (4)

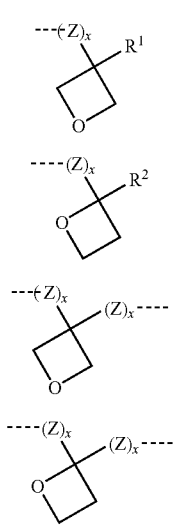

where the following applies to the symbols and indices used:

$R^1$ is on each occurrence, identically or differently, H, a straight-chain, branched or cyclic alkyl, alkoxy or thioalkoxy group having 1 to 20 C atoms, an aromatic or heteroaromatic ring system having 5 to 24 aromatic ring atoms or an alkenyl group having 2 to 10 C atoms, in which one or more hydrogen atoms may be replaced by halogen or CN and one or more non-adjacent C atoms may be replaced by —O—, —S—, —CO—, —COO—, —O—CO—;

$R^2$ is on each occurrence, identically or differently, H, a straight-chain, branched or cyclic alkyl group having 1 to 20 C atoms, an aromatic or heteroaromatic ring system having 5 to 24 aromatic ring atoms or an alkenyl group having 2 to 10 C atoms, in which one or more hydrogen atoms may be replaced by halogen or CN and one or more non-adjacent C atoms may be replaced by —O—, —S—, —CO—, —COO—, —O—CO—;

Z is on each occurrence, identically or differently, a divalent group —$(CR^3R^4)_n$—, in which, in addition, one or more non-adjacent C atoms may be replaced by —O—, —S—, —CO—, —COO— or —O—CO—, or a divalent aromatic or heteroaromatic ring system having 5 to 40 aromatic ring atoms, which may also be substituted by one or more radicals $R^3$;

$R^3$, $R^4$ are on each occurrence, identically or differently, hydrogen, a straight-chain, branched or cyclic alkyl, alkoxy or thioalkoxy group having 1 to 20 C atoms, an aryl or heteroaryl group having 5 to 20 aromatic ring atoms or an alkenyl group having 2 to 10 C atoms, in which, in addition, one or more hydrogen atoms may be replaced by halogen or CN; radicals $R^3$ or $R^4$ may also form a ring system here with one another or with $R^1$ or $R^2$;

n is on each occurrence, identically or differently, an integer between 0 and 30, preferably between 1 and 20, in particular between 2 and 12;

x is on each occurrence, identically or differently, an integer between 0 and 5, preferably between 1 and 3;

with the proviso that the number of groups of the formula (1) or formula (2) or formula (3) or formula (4) is limited by the maximum number of available, i.e. substitutable, H atoms of the organic semiconductor or conductor.

The dashed bond in formulae (1) to (4) indicates the link to the organic semiconductor. It should not be taken to mean a methyl group here.

The crosslinking can be initiated by addition of a photoacid, i.e. a compound which liberates protons on irradiation with light of suitable wavelength, and irradiation with light, as described, for example, in the unpublished application DE 102004009355.5. The crosslinking of these units can also be carried out, for example, by thermal treatment of the device at this stage, in particular if the crosslinkable buffer layer is applied to a layer of a doped conductive polymer, as described, for example, in the unpublished application DE 10340711.1.

In the case of foamed layers, the crosslinking can be carried out before, during or after the foaming process. The crosslinking is preferably carried out during the foaming process, which means that the foaming process and the crosslinking process overlap in time, where the course of the two processes over time need not be identical. This enables the foam formed to be stabilised particularly well.

If the porous layer is produced through the use of porogens, it is particularly preferred to carry out the crosslinking after the production and conditioning of the layer and before the removal of the porogen.

The buffer layer according to the invention can comprise low-molecular-weight compounds which are crosslinked in the layer and thus rendered insoluble. Preference is given to the use of oligomeric, dendritic or polymeric soluble compounds, which are preferably rendered insoluble by subsequent crosslinking.

Preferred materials for the buffer layer are derived from hole-conducting materials, as are also used as hole conductors in other applications. Particularly preferably suitable for this purpose are crosslinkable materials based on triarylamine, based on thiophene, based on triarylphosphine and/or based on pyrrole. The potentials of these compounds can be adjusted through suitable substitution. Thus, introduction of electron-withdrawing substituents (for example F, Cl, CN, etc.) gives compounds having a lower HOMO (=highest occupied molecular orbital), while introduction of electron-donating substituents (for example alkoxy groups, amino groups, etc.) produces a higher HOMO. Since the buffer layer is preferably relatively thick, it may be preferred for it to comprise free charge carriers and to be intrinsically electrically conductive. It may thus preferably be an organic electrical conductor, which in the ideal case exhibits ohmic behaviour, i.e. in which the current is proportional to the applied voltage, preferably having a conductivity $>10^{-8}$ S/cm, particularly preferably having a conductivity in the order of $10^{-7}$ to $10^{-1}$ S/cm, very particularly preferably having a conductivity in the order of $10^{-6}$ to $10^{-2}$ S/cm. It is therefore preferred for the buffer layer to be doped. The doping can be carried out, for example, by means of acids (Brönsted and/or Lewis acids) and/or by means of oxidants. Apart from the above-mentioned materials, foamed layers of doped PEDOT (poly(ethylenedioxythiophene)) or doped PANI (polyaniline) are also suitable here. However, undoped layers may also exhibit the desired effect and may also have adequately high charge-carrier mobility.

For the production of the devices, a general process is generally used, as described, for example, in the unpublished application DE 10340711.1, which should be correspondingly adapted for the individual case without further inventive step. The way in which suitable layers of low refractive index or suitable porous layers or foams can be produced has already been described in detail above.

Surprisingly, the electronic device structure according to the invention, in which an organic buffer layer of low refractive index is used, offers the following advantages:

1) The output of light from the electronic device is significantly improved.
2) As a consequence, the observed efficiency of the organic electronic device, in particular also the power efficiency, is increased. This is of vital importance for practical use, in particular for mobile applications.
3) Due to the increased efficiency, the lifetime of the organic electronic device is also increased since this is always dependent on the brightness and current density with which the device is operated, and, due to the higher output efficiency, an organic light-emitting diode can now be operated with lower current density for the same observed brightness.
4) The novel structure of the organic electronic device can be achieved without difficulty. In particular, considerable technical complexity is not necessary, in contrast to structures in accordance with the prior art.
5) The novel structure does not exhibit any angle dependence in the opto-electronic behaviour (for example no viewing-angle dependence of the emission characteristics).
6) In solar cells and detectors, the sensitivity on use in diffuse light is improved.
7) The novel structure can be combined without difficulties with the materials usually used and the layer structure usually used. It is thus possible to integrate the buffer layer according to the invention into the device without significant changes in the structure.

The present invention is explained in greater detail by the following examples without wishing it to be restricted thereto. These examples are only directed to organic and polymeric light-emitting diodes. However, the person skilled in the art will be able to produce further electronic devices, such as, for example, organic solar cells, optical amplifiers, optical detectors, field-quenching devices and organic lasers, to mention but a few further applications, from the examples mentioned without inventive step.

EXAMPLES

Example 1

Reduction in the Refractive Index Through Addition of an Alkyl Compound of Lower Refractive Index

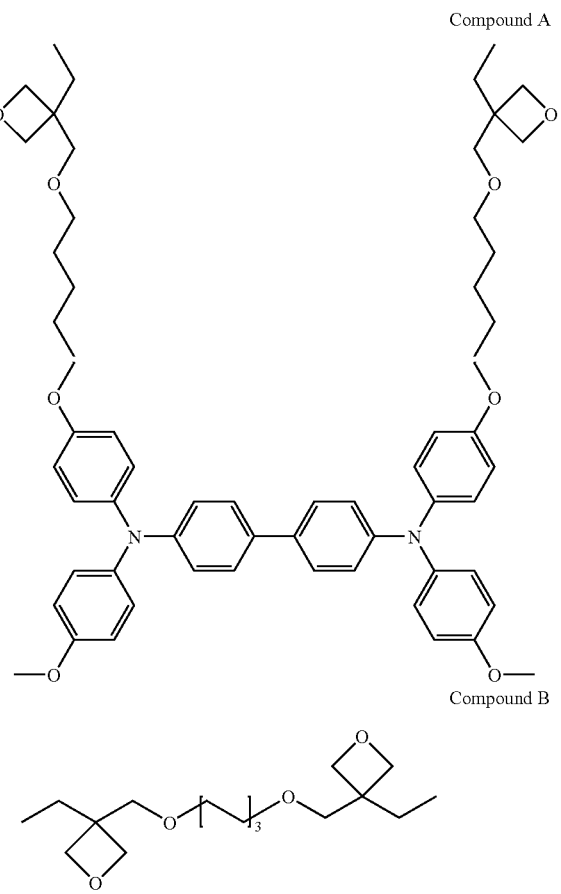

If an alkyl compound B of lower refractive index (n=1.46) is copolymerised with the hole conductor A (refractive index n=1.64), the refractive index of the hole-conducting layer can be reduced thereby. In the present example, addition of 25% by weight of B produces a reduction in the overall refractive index to 1.59.

The variation of the hole-conductor layer thickness at the same time as variation of the emitter layer thickness (total thickness constant at 100 nm) results in a maximum of the efficiency at a layer thickness of 40 nm of hole conductor under 60 nm of emitter material.

In the comparison of the data, the addition of 25% by weight of the alkyl compound B results in an efficiency improvement of about 25%. The U/I characteristic lines for variation of the layer thicknesses are shown in FIG. 1.

Emitter polymers at constant total thickness (100 nm); device structure: ITO/PEDOT (20 nm)/X-HTL (x nm)/BLUE (100−x nm)/Ba (4 nm)/Ag (100 nm).

Left: hole conductor A (100% by weight); right: hole conductor A (75% by weight)+alkyl compound B (25% by weight)

FIG. 2 shows the maximum efficiencies of the devices as a function of the layer thickness of the crosslinked hole-conductor layer and the ratio of the efficiencies with and without addition of B. Copolymerisation of 25% by weight of B produces an average improvement in the efficiency of 20-25%.

Example 2

Reduction in the Refractive Index Through Production of Nano-porous Structures

The production of cavities on a nanometer scale in the hole-conductor layer in order to reduce the refractive index is achieved by selective washing-out after phase separation. An uncrosslinkable hole conductor derivative (compound C) was added to the crosslinkable hole conductor (compound A).

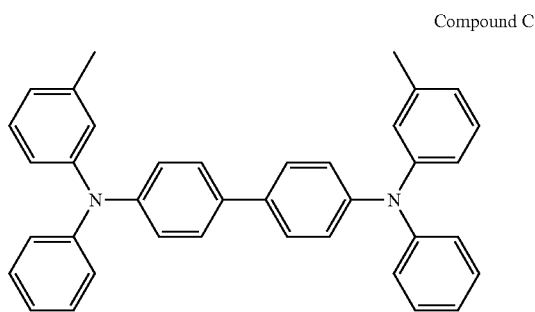

Compound C

A layer of this mixture was produced by spin coating, phase separation was achieved by heating the layer, the crosslinkable domain was stabilised by exposure, and the uncrosslinked component was rinsed out in a final rinsing step.

As was demonstrated with the aid of an atomic force microscope (AFM), nanoscale structures (diameter 200-300 nm; depth 10-15 nm) are formed in the layer (FIG. 3).

The invention claimed is:

1. An organic electronic device comprising cathode and anode, at least one of which is transparent, and at least one layer comprising at least one organic semi-conductor, characterised in that at least one organic buffer layer which has a low refractive index is introduced between the transparent electrode and the layer which comprises the organic semiconductor and said buffer layer has a refractive index n<1.5.

2. Organic electronic device according to claim 1, characterised in that the refractive index n of the buffer layer is between 1.2 and 1.4.

3. Organic electronic device according to claim 1, wherein the organic electronic device is an organic or polymeric light-emitting diode, an organic solar cell, an organic optical detector, an organic laser diode, a field-quenching device or an organic optical amplifier.

4. Organic electronic device according to claim 1, wherein the cathode is made of metals, metal alloys or multilayered structures with various metals, at least one of which has a low work function.

5. Organic electronic device according to claim 1, wherein the anode has a potential of greater than 4.5 eV vs. vacuum.

6. Organic electronic device according to claim 5, characterised in that a mixed metal oxide is used as anode.

7. Organic electronic device according to claim 1, wherein the organic semiconductor is low-molecular-weight, oligomeric, dendritic or polymeric.

8. Organic electronic device according to claim 1, wherein the total layer thickness of the organic semiconductor(s) is 10-300 nm.

9. Organic electronic device according to claim 1, wherein a hole-injection layer is used on the anode.

10. Organic electronic device according to claim 2, wherein the layer thickness of the buffer layer is in the range 50-1000 nm.

11. Organic electronic device according to claim 1, wherein the layer of low refractive index is produced through the use of compounds of low refractive index.

12. Organic electronic device according to claim 2, wherein the organic buffer layer of low refractive index is a porous layer whose pore size is in the nanometer region.

13. Organic electronic device according to claim 12, characterised in that the pores of the buffer layer are closed.

14. An organic electronic device comprising cathode and anode, at least one of which is transparent, and at least one layer comprising at least one organic semi-conductor, characterised in that at least one organic buffer layer which has a low refractive index is introduced between the transparent electrode and the layer which comprises the organic semiconductor and the buffer layer is open-pored, and the surface is thermally sealed.

15. Organic electronic device according to claim 12, wherein the pore size of the layer is in an order of magnitude of 5 to 500 nm.

16. Organic electronic device according to claim 12, wherein the porosity of the buffer layer is between 20 and 80%.

17. Organic electronic device according to claim 12, wherein the porous layer is produced by means of porogens, which are removed from the layer after the layer formation.

18. Organic electronic device according to claim 12, wherein the buffer layer is foamed.

19. Organic electronic device according to claim 18, characterised in that the blowing agents used are compressed gases or low-boiling hydrocarbons.

20. Organic electronic device according to claim 18, characterised in that the blowing agents used are supercritical fluids.

21. Organic electronic device according to claim 18, characterised in that the buffer layer is foamed by means of chemical blowing agents.

22. Organic electronic device according to claim 18, wherein finely dispersed solids of nanometer size are added as nucleation seeds.

23. Organic electronic device according to claim 18, wherein emulsions are used.

24. Organic electronic device according to claim 23, characterised in that micro-emulsions or finely divided emulsions are developed from a supercritical blowing agent in polymer.

25. An organic electronic device comprising cathode and anode, at least one of which is transparent, and at least one layer comprising at least one organic semi-conductor, characterised in that at least one organic buffer layer which has a low refractive index is introduced between the transparent electrode and the layer which comprises the organic semiconductor and the organic buffer layer is crosslinked.

26. Organic electronic device according to claim 25, characterised in that organic materials are used in which at least one H atom has been replaced by a group which reacts by cationic ring-opening polymerisation.

27. Organic electronic device according to claim 26, characterised in that the crosslinking takes place via oxetane groups.

28. Organic electronic device according to claim 27, characterised in that use is made in the buffer layer of low-molecular-weight, oligomeric, dendritic or polymeric organic semiconductors or conductors in which at least one H atom has been replaced by a group of the formula (1), formula (2), formula (3) or formula (4)

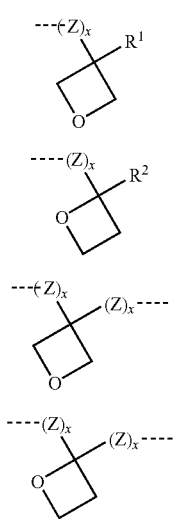

where
- $R^1$ is on each occurrence, identically or differently, H, a straight-chain, branched or cyclic alkyl, alkoxy or thioalkoxy group having 1 to 20 C atoms, an aromatic or heteroaromatic ring system having 5 to 24 aromatic ring atoms or an alkenyl group having 2 to 10 C atoms, in which one or more hydrogen atoms is optionally replaced by halogen or CN and one or more non-adjacent C atoms is optionally replaced by —O—, —S—, —CO—, —COO—, —O—CO—;
- $R^2$ is on each occurrence, identically or differently, H, a straight-chain, branched or cyclic alkyl group having 1 to 20 C atoms, an aromatic or heteroaromatic ring system having 5 to 24 aromatic ring atoms or an alkenyl group having 2 to 10 C atoms, in which one or more hydrogen atoms is optionally replaced by halogen or CN and one or more non-adjacent C atoms is optionally replaced by —O—, —S—, —CO—, —COO—, —O—CO—;
- Z is on each occurrence, identically or differently, a divalent group —$(CR^3R^4)_n$—, in which, in addition, one or more non-adjacent C atoms is optionally replaced by —O—, —S—, —CO—, —COO— or —O—CO—, or a divalent aromatic or heteroaromatic ring system having 5 to 40 aromatic ring atoms, which is optionally substituted by one or more radicals $R^3$;
- $R^3$, $R^4$ are on each occurrence, identically or differently, hydrogen, a straight-chain, branched or cyclic alkyl, alkoxy or thioalkoxy group having 1 to 20 C atoms, an aryl or heteroaryl group having 5 to 20 aromatic ring atoms or an alkenyl group having 2 to 10 C atoms, in which, in addition, one or more hydrogen atoms is optionally replaced by halogen or CN; radicals $R^3$ or $^4$ optionally forms a ring system here with one another or with $R^1$ or $R^2$;
- n is on each occurrence, identically or differently, an integer between 0 and 30;
- x is on each occurrence, identically or differently, an integer between 0 and 5,
  with the proviso that the number of groups of the formula (1) or formula (2) or formula (3) or formula (4) is limited by the maximum number of available H atoms of the organic semiconductor or conductor; the dashed line here describes the link to the organic semiconductor or conductor.

29. Organic electronic device according to claim 25, wherein the crosslinking is carried out during the foaming process.

30. Organic electronic device according to claim 25, wherein the crosslinking is carried out after application and where appropriate conditioning of the layer and before the removal of the porogens.

31. Organic electronic device according to claim 2, wherein the materials for the buffer layer are hole-conducting.

32. Organic electronic device according to claim 31, characterised in that the materials for the buffer layer are doped.

33. An organic electronic device comprising cathode and anode, at least one of which is transparent, and at least one layer comprising at least one organic semi-conductor, characterised in that at least one organic buffer layer which has a low refractive index is introduced between the transparent electrode and the layer which comprises the organic semiconductor and the materials for the buffer layer are doped materials based on triarylamine, based on thiophene, based on triaryiphosphine and/or based on pyrrole.

34. An organic electronic device comprising cathode and anode, at least one of which is transparent, and at least one layer comprising at least one organic semi-conductor, characterised in that at least one organic buffer layer which has a low refractive index is introduced between the transparent electrode and the layer which comprises the organic semiconductor and the buffer layer is produced through the use of compounds having long alkyl chains and/or fluorinated compounds.

35. Organic electronic device according to claim 12, characterised in that the buffer layer is open-pored, and the surface is thermally sealed by irradiation with a laser or by infrared irradiation.

36. The organic electronic device as claimed in claim 1, wherein said buffer layer has a refractive index n<1.4.

37. The organic electronic device as claimed in claim 1, wherein the device is an organic or polymeric light-emitting diode.

* * * * *